(12) United States Patent
Anglin et al.

(10) Patent No.: US 11,053,580 B2
(45) Date of Patent: Jul. 6, 2021

(54) TECHNIQUES FOR SELECTIVE DEPOSITION USING ANGLED IONS

(71) Applicant: Varian Semiconductor Equipment Associates, Inc., Gloucester, MA (US)

(72) Inventors: Kevin Anglin, Somerville, MA (US); Maureen Petterson, Salem, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 552 days.

(21) Appl. No.: 15/901,303

(22) Filed: Feb. 21, 2018

(65) Prior Publication Data
US 2019/0256966 A1 Aug. 22, 2019

(51) Int. Cl.
| | | |
|---|---|---|
| C23C 14/04 | (2006.01) | |
| H01L 21/285 | (2006.01) | |
| H01L 21/02 | (2006.01) | |
| C23C 14/34 | (2006.01) | |
| C23C 14/06 | (2006.01) | |
| C23C 14/16 | (2006.01) | |
| C23C 14/46 | (2006.01) | |
| C23C 14/22 | (2006.01) | |

(52) U.S. Cl.
CPC ............ *C23C 14/048* (2013.01); *C23C 14/04* (2013.01); *C23C 14/0605* (2013.01); *C23C 14/16* (2013.01); *C23C 14/225* (2013.01); *C23C 14/3442* (2013.01); *C23C 14/3471* (2013.01); *C23C 14/46* (2013.01); *H01L 21/02115* (2013.01); *H01L 21/02266* (2013.01); *H01L 21/2855* (2013.01)

(58) Field of Classification Search
None
See application file for complete search history.

(56) References Cited

U.S. PATENT DOCUMENTS

| | | | |
|---|---|---|---|
| 3,271,286 A | | 9/1966 | Lepselter |
| 3,436,327 A | | 4/1969 | Shockley |
| 3,676,317 A | | 7/1972 | Harkins, Jr. |
| 3,943,047 A | | 3/1976 | Cruzan et al. |
| RE29,947 E | | 3/1979 | Van Ommeren |
| 4,599,135 A | * | 7/1986 | Tsunekawa ............ C23C 16/452 118/50.1 |
| 5,419,805 A | * | 5/1995 | Jolly ................. H01L 21/32136 257/E21.311 |

(Continued)

OTHER PUBLICATIONS

Kim, et al., "A Process for Topographically Selective Deposition on 3D Nanostructures by Ion Implantation," ACSNano, 2016, 10, 4451-4458.

(Continued)

*Primary Examiner* — Jason Berman
(74) *Attorney, Agent, or Firm* — Kacvinsky Daisak Bluni PLLC

(57) ABSTRACT

A method includes providing a substrate, where the substrate has a patterned substrate surface, wherein the patterned substrate surface comprises a first surface region and a second surface region. The method may also include directing a depositing species to the patterned substrate surface; and directing angled ions to the patterned substrate surface, wherein the depositing species forms a deposit on the first surface region and does not form a deposit on the second surface region.

16 Claims, 9 Drawing Sheets

(56) References Cited

U.S. PATENT DOCUMENTS

| | | | |
|---|---|---|---|
| 5,885,425 A * | 3/1999 | Hsieh | C23C 14/046 |
| | | | 204/192.12 |
| 8,815,344 B2 | 8/2014 | Ma | |
| 9,385,219 B2 | 7/2016 | Yieh et al. | |
| 9,564,312 B2 | 2/2017 | Henri et al. | |
| 2013/0334511 A1 * | 12/2013 | Savas | H01L 31/02167 |
| | | | 257/40 |
| 2016/0230268 A1 * | 8/2016 | Druz | C23C 14/35 |

OTHER PUBLICATIONS

Hashemi, et al., "Selective Deposition of Dielectrics: Limits and Advantages of Alkanethiol Blocking Agents on Metal—Dielectric Patterns," ACS Appl. Mater. Interfaces 2016, 8, 33264-33272.

* cited by examiner

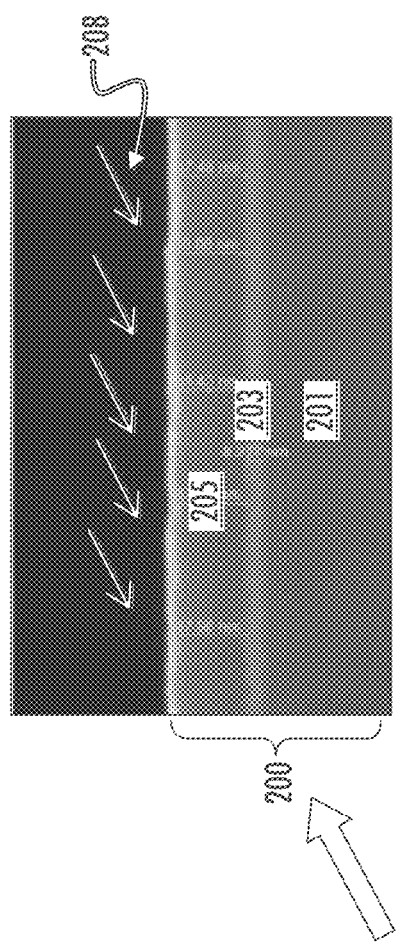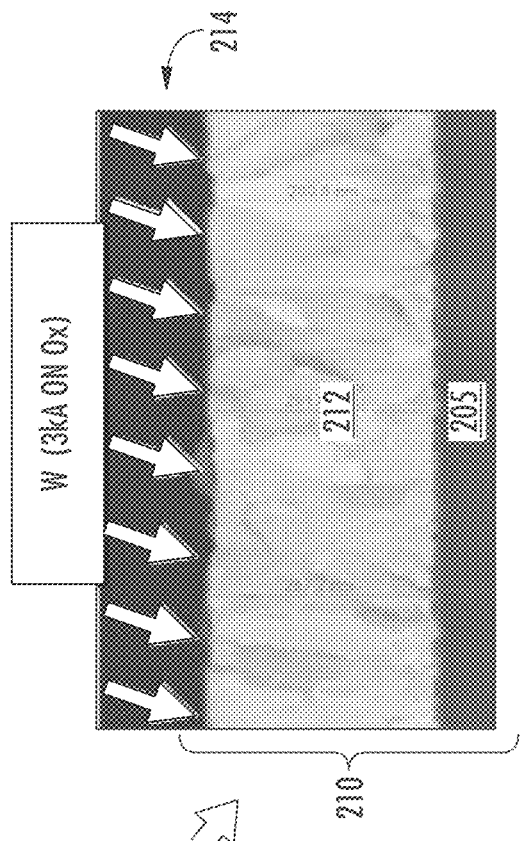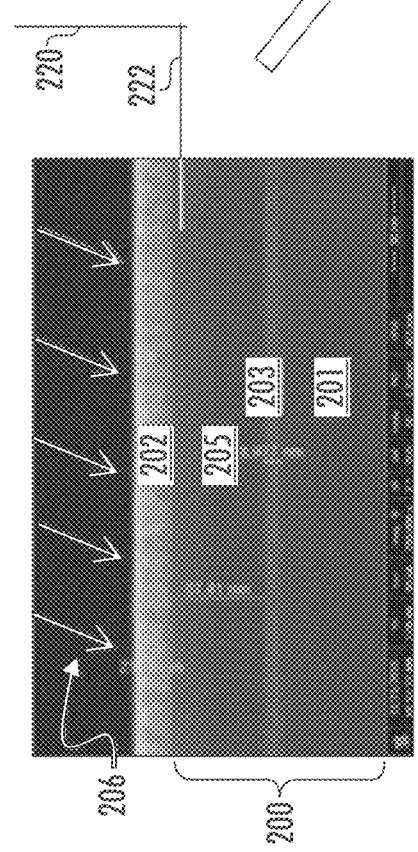

W XD-40 STRUCTURE
Si: 130 nm
W: 130 nm

SELECTIVE Si ETCH
Kr, 0.8 keV, 66° TILT
102 nm   32 nm

▲ W REMOVED: 28 nm
▲ Si REMOVED: 98 nm
▲ SELECTIVITY: 1 : 3.5

1:1 SELECTIVITY
Kr, 3 keV, 45° TILT
85 nm   85 nm

▲ W REMOVED: 35 nm
▲ Si REMOVED: 35 nm
▲ SELECTIVITY: 1 : 1

SELECTIVE W ETCH
Kr, 0.8 keV, 0° TILT
74 nm   117 nm

▲ W REMOVED: 56 nm
▲ Si REMOVED: 13 nm
▲ SELECTIVITY: 4.3 : 1

TECHNIQUES FOR SELECTIVE DEPOSITION USING ANGLED IONS

FIELD

The present embodiments relate to device processing, and more particularly, to selective deposition of a given material on a substrate.

BACKGROUND

In the present day, semiconductor and other devices are scaled to smaller and smaller deposition, where such devices may be formed of many different materials, having complex structures, often arranged in multiple different layers on a substrate. One approach to address the increasing complexity of materials and device structures is selective deposition of a given material, which approach may be especially useful to address patterning issues of a device at the micrometer level or nanometer level. Errors in pattern placement and difficulties of producing a seamless bottom up fill process are particular areas where adequate solutions are lacking. Atomic layer deposition (ALD) poisoning, a method where certain materials are selectively modified to prevent ALD nucleation, is an increasingly popular method for selectively depositing on one material or one particular orientation of a layer. Such matters depend in particular on sensitive control of chemistry within a deposition chamber.

With respect to these and other considerations the present disclosure is provided.

BRIEF SUMMARY

In one embodiment, a method may include providing a substrate, where the substrate having a patterned substrate surface, wherein the patterned substrate surface comprises a first surface region and a second surface region. The method may include directing a depositing species to the patterned substrate surface, and directing angled ions to the patterned substrate surface, wherein the depositing species forms a deposit on the first surface region and does not form a deposit on the second surface region.

In another embodiment, a method may include providing a substrate, the substrate having a patterned substrate surface, wherein the patterned substrate surface comprises a first surface region and a second surface region. The method may also include directing a depositing species as angled ions to the patterned substrate surface of a substrate, at an angle of incidence with respect to a perpendicular to a plane of the substrate. As such, at the angle of incidence, the angled ions may generate a first sputter yield on the first surface region and a second sputter yield on the second surface region, greater than the first sputter yield, and wherein the depositing species forms a deposit on the first surface region and does not form a deposit on the second surface region.

In another embodiment, an apparatus may include a process chamber to house a patterned substrate, the patterned substrate comprising a first surface region and a second surface region. The apparatus may include a first ion source, disposed adjacent the process chamber and arranged to generate first ions as a depositing species, and a controller, coupled to the ion source. The controller may include at least one computer readable medium comprising instructions, where the instructions, when executed, cause the controller to receive a set of selective deposition information, and generate a set of process parameters responsive to the selective deposition information. The set of process parameters may include at least one of an ion energy, an angle of incidence, and a substrate temperature, the process parameters to be applied to the first ion source.

BRIEF DESCRIPTION OF THE DRAWINGS

FIG. 3A and FIG. 3B present results showing the use of angled ions to selectively deposit a material on a substrate, according to some embodiments of the disclosure;

FIG. 4 illustrates another example, showing the effect of substrate material on deposition from an aluminum ion beam, according to embodiments of the disclosure;

Figure 1A:
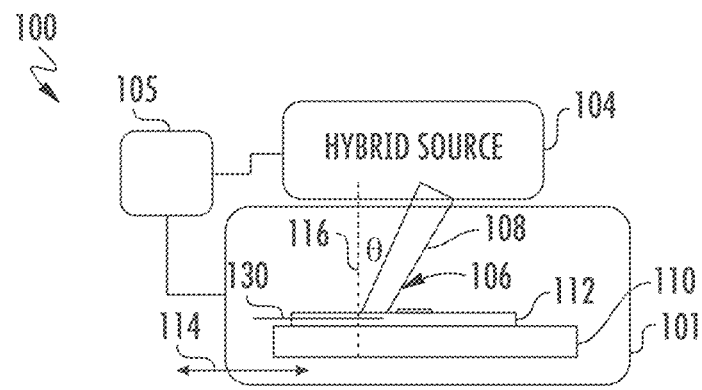
FIG. 1A shows a selective deposition system, according to embodiments of the disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

In accordance with some embodiments, novel approaches for selectively forming a material on a substrate, and in particular, novel approaches are provided for building device structures using selective deposition facilitated by angled ions.

Turning now to FIG. 1A, there is shown a selective deposition system, denoted as deposition system 100, according to embodiments of the disclosure. The deposition system 100 includes an ion source 104, as well as substrate stage 110. In some embodiments, the substrate stage 110 may be housed in a process chamber 101. The ion source 104 may be a known source such as a plasma source, an indirectly heated cathode source, Kaufman source, beamline source, or other source. The embodiments are not limited in this context.

In various embodiments, the substrate stage 110 may be scannable along a scan direction 114. The ion source 104 may direct angled ions 108 to the substrate, where the substrate stage 110 may be provided with components (not shown) to adjust the angle of incidence of angled ions 108 with respect to a perpendicular 116 to a plane of the substrate 110 (see also FIG. 2), the where the angle of incidence, shown as θ. The value of the angle of incidence of angled ions may range from zero degrees up to 60 degrees, 70 degrees, or 85 degrees in some embodiments. The embodiments are not limited in this context.

Advantageously, the deposition system 100 may employ the ion source 104 as a hybrid source, where the ion source 104 also acts as a deposition source. In conjunction with the control of the substrate stage 110, the ion source 104 may perform selective deposition of depositing species 106 on the substrate 112, as detailed below. In brief, the depositing species 106 may form a part or the whole of the angled ions 108. In some embodiments, a controller 105 may be provided in deposition system 100, coupled to the ion source 104, to adjust process parameters including deposition rate and species type for the depositing species 106, angle of incidence of angled ions 108, energy of angled ions 108, substrate temperature, and other process parameters. The controller 105 may also be configured to generate a scan signal to scan the substrate stage 110. As detailed below, by appropriate selection of a combination of parameters, a maskless selective deposition of the depositing species 106 may be accomplished on targeted regions of the substrate 112.

Figure 1B:
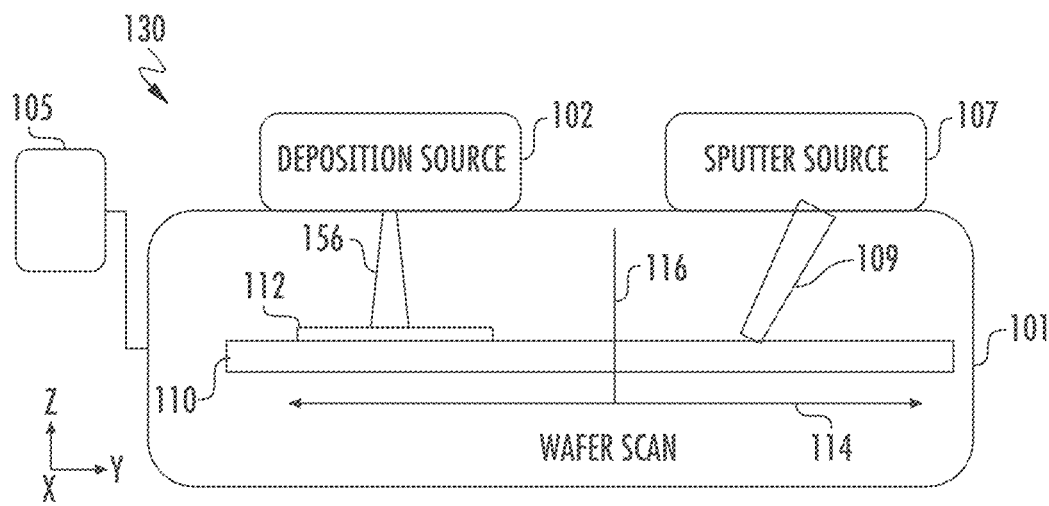
FIG. 1B shows another selective deposition system, according to other embodiments of the disclosure.

Turning now to FIG. 1B, there is shown another selective deposition system, denoted as deposition system 130, according to embodiments of the disclosure. The deposition system 130 includes a deposition source 102, and an ion source 107, as well as substrate stage 110. In some embodiments, the substrate stage 110 may be housed in a process chamber 101. In some embodiments, the deposition source 102 may be an ion source, similar to the ion source 104, described above.

In various embodiments, the substrate stage 110 may be scannable along a scan direction 114, wherein the substrate 112 is disposed at a first substrate position, shown as P1 when exposed to depositing species 106, generated by deposition source 102. The substrate 112 may be scanned along the scan direction 114 the substrate 112 is disposed at a second position, shown as P2, when the substrate 112 is exposed to the ion source 104. In particular, the ion source 107 may direct angled ions 109 to the substrate, where the substrate stage 110 may be provided with components (not shown) to adjust the angle of incidence of angled ions 109 with respect to a perpendicular 116 to a plane of the substrate 132 (see FIG. 2), shown as θ. In some embodiments the angled ions 109 may function to aid selective deposition of the depositing species, while not having depositing species among the angled ions 109. In this context, examples of angled ions include inert gas ions, oxygen, nitrogen, and so forth.

Advantageously, the deposition system 100 may employ the deposition source 102, substrate stage 110, and the ion source 107 to perform selective deposition of depositing species 106 on the substrate 112, as detailed below. In some embodiments, the controller 105 may be provided in deposition system 100 to adjust process parameters including deposition rate and species type for the depositing species 106, angle of incidence of angled ions 109, energy of angled ions 109, control of any ions produced from deposition source 102, and other process parameters. As detailed below, by appropriate selection of a combination of parameters, a maskless selective deposition of the depositing species 106 may be accomplished on targeted regions of the substrate 112.

Notably, the deposition system 130 is arranged to perform separate exposure of a substrate 112 to the ion source 107 as opposed to deposition source 102, wherein the substrate 112 may be scanned along the scan direction 114 between a first instance of directing the depositing species 106 to the substrate 112, and a second instance of directing the angled ions 109 to the substrate 112. In other embodiments, a system may expose a substrate to depositing species simultaneously to exposing the substrate to angled ions.

Figure 1C:
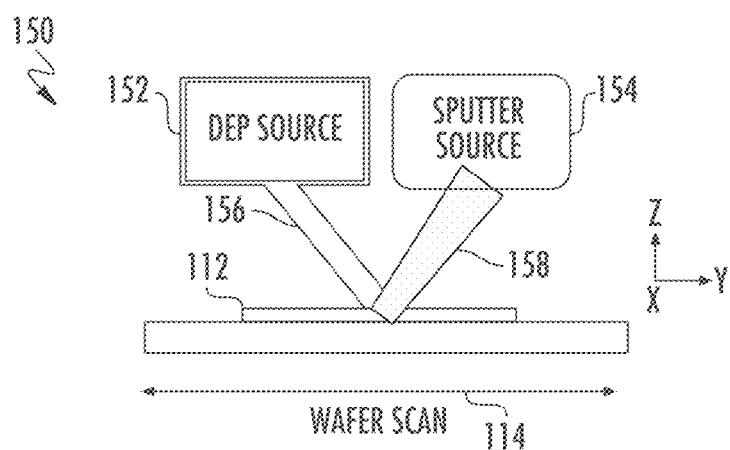
FIG. 1C illustrates a system, wherein a deposition source and an ion source are arranged proximate to one another, according to embodiments of the disclosure.

FIG. 1C illustrates a system 150, wherein a deposition source 152 and an ion source 154 are arranged proximate to one another, wherein the substrate 112 is simultaneously exposed to depositing species 156 and angled ions 158. In various embodiments, the deposition source 152 may be similar to deposition source 102, while the ion source 154 is similar to ion source 107. In various embodiments the depositing species 156 may also be angled ions and may promote selective deposition of material from the depositing species 156, in conjunction with the angled ions 158. In some examples where the depositing species 156 are also angled ions, the deposition source 152 and ion source 154 may be independently rotatable on a gantry system to allow adjustment of the angle of incidence for angled ions produced by the deposition source 152, as well as the ion source 154.

In the embodiments of FIG. 1A, FIG. 1B, and FIG. 1C a similar selective deposition process may be accomplished, wherein a depositing species deposits on a first surface region of a substrate and does not deposit on a second surface region of a substrate. In further embodiments, both angled ions and depositing species may be provided from just one source, such as an ion source. In some embodiments, the angled ions and depositing species may be one and the same.

Figure 2:
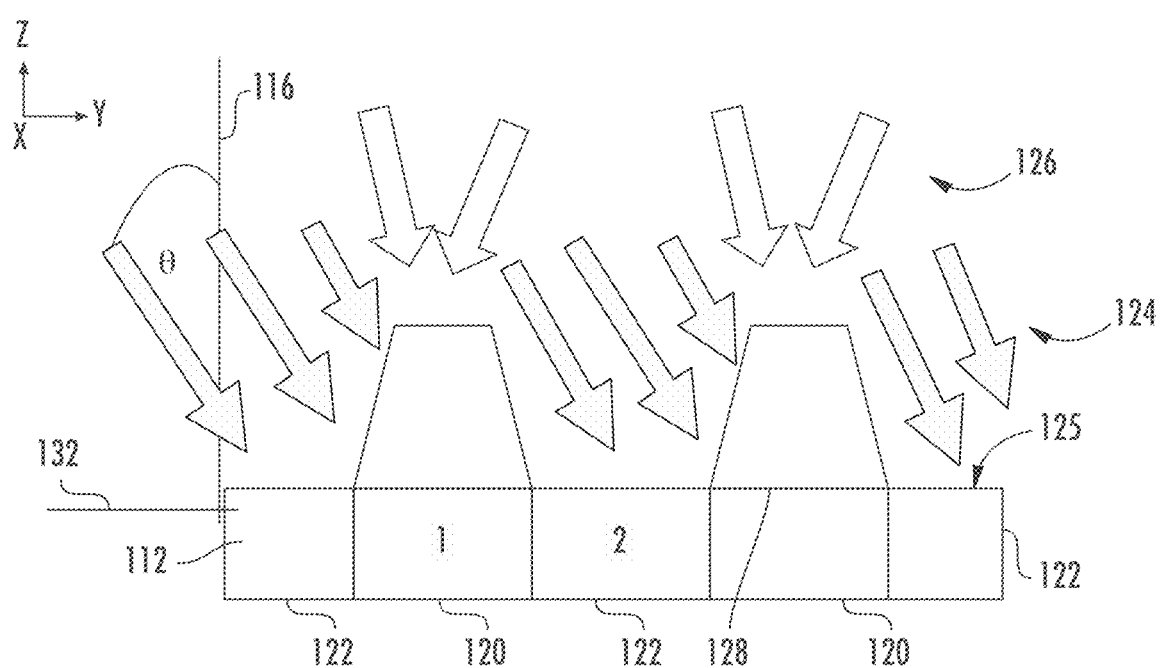
FIG. 2, shows a scenario for selective deposition, according to some embodiments of the disclosure.

Turning now to FIG. 2, there is shown a scenario for selective deposition, according to some embodiments of the disclosure. In FIG. 2 the substrate 112 includes a patterned substrate surface 125, where the patterned substrate surface 125 includes a first surface region 120 and a second surface region 122. As shown in FIG. 2, depositing species 126 are directed to the substrate 112, in addition to angled ions 124. In various embodiments the depositing species 126 and angled ions 124 may be provided simultaneously to one another or separately from one another, while in particular embodiments, the angled ions 124 and depositing species 126 may the same species. According to some embodiments, the first surface region 120 may be formed of a first material while the second surface region 122 is formed of a second material, different from the first material. In other embodiments, the first surface region 120 and second surface region 122 may represent different surfaces of a surface feature, such as a three-dimensional surface feature.

As shown in FIG. 2, the result of the directing the depositing species 126 and the angled ions 124 is to form a deposit 128 on the first surface region 120 and not on the second surface region 122. Accordingly, the deposition system 100, deposition system 130, system 150, or similar system, may be used to selectively deposit a material on a patterned substrate while not requiring masking. Another notable feature of FIG. 2 is where the deposit 128 is self-aligned to the first surface region 120, so the deposit 128 forms in isolated regions, where those regions coincide with the first surface regions 120.

FIG. 3A and FIG. 3B present results showing the use of angled ions to selectively deposit a material on a substrate 200, according to some embodiments of the disclosure. In FIG. 3A, a substrate formed of a silicon base 201, having an oxide layer 203, and polysilicon top layer 205 was exposed to an aluminum ion beam made of 500 eV $Al^+$ ions, shown as angled ions 206. The angled ions 206 were directed to the substrate 200 at an angle of incidence of 25 degrees with respect to a perpendicular 220 to a plane 222 of the substrate 200. The aluminum ions may also act as depositing species, condensing on the substrate 200, to form a layer 202 having a thickness of 21.5 nm. Turning to FIG. 3B, in this example, 500 eV $Al^+$ ions, shown as ions 208, are directed to the substrate 200 at an angle of incidence of 65 degrees with respect to the perpendicular 220, resulting in no deposition of aluminum, and a slight resputtering of the polysilicon top layer 205, about 3 nm. Accordingly, the increase in the angle of incidence of the aluminum ion beam over the above range results in prevention of layer formation of the aluminum material on the polysilicon surface.

Turning now to FIG. 4, there is shown another example, illustrating the effect of substrate material on deposition from an aluminum ion beam. The substrate 210 is formed of a polysilicon top layer 205 and a tungsten overlayer 212, having a thickness of approximately 300 nm. A 3 keV $Al^+$ ion beam, shown as ions 214, is directed to the substrate 210 at an angle of incidence of 25 degrees with respect to the perpendicular 220. In this case, no deposition of aluminum is observed, in contrast to the 20 nm layer deposited by the 500 eV $Al^+$ beam incident on polysilicon at an angle of incidence of 25 degrees in FIG. 3A.

Returning now to FIG. 2, in view of the results of FIG. 3A, FIG. 3B, and FIG. 4, in some embodiments, where the first surface region 120 is a first material and the second surface region 122 is a second material, the angle of incidence, as well as the ion energy of angled ions 124 may be tuned to selectively form the deposit 128 just on the first surface region 120. In embodiments where the angled ions 124 are also depositing species, and the depositing species 126 are not separately provided, the value of the angle of incidence may be selected so net deposition of material from the angled ions 124 takes place on the first surface region 120 and not on the second surface region 122. Thus, in the example where the first surface region 120 is polysilicon and second surface region 122 is tungsten, and where the angled ions 124 are $Al^+$, providing the angled ions 124 at an angle of incidence of 25 degrees with respect to the perpendicular 116 may result in the selective deposition of the deposit 128, as shown.

In other embodiments, where depositing species 126 are separately provided, another degree of control of selective deposition may be realized, since the relative flux of depositing species with respect to the flux of angled ions may be independently controlled. In particular, in some embodiments, in addition to depositing species, angled ions such as inert gas, oxygen, or nitrogen, may be directed to a substrate, where the angled ions do not form part of a depositing species. In these additional embodiments, selective deposition on a patterned substrate may proceed as shown in FIG. 2 by appropriate choice of ion species for angled ions, angle of incidence of angled ions, ion energy of angled ions, the different materials in the first surface region and second surface region, or any combination of the above.

Figure 5A:
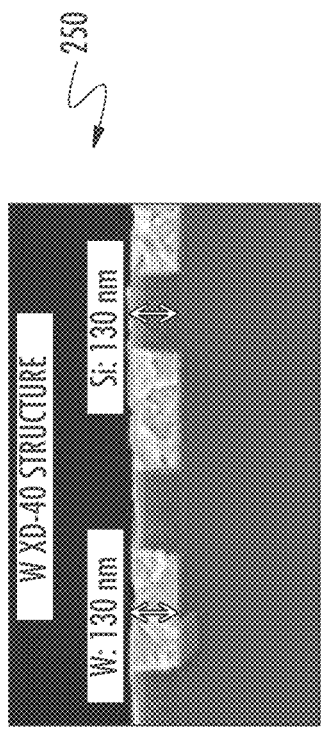
FIG. 5A, FIG. B.
Figure 5D:
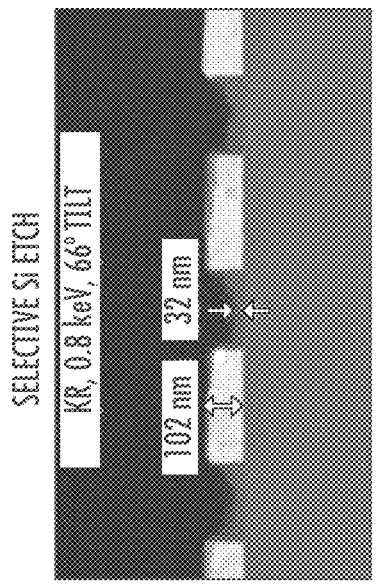
FIG. 5C, and FIG. 5D show one example of tuning of selective deposition in accordance with the present embodiments.
Figure 5C:
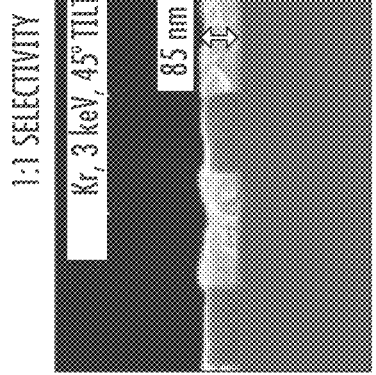
Figure 5B:
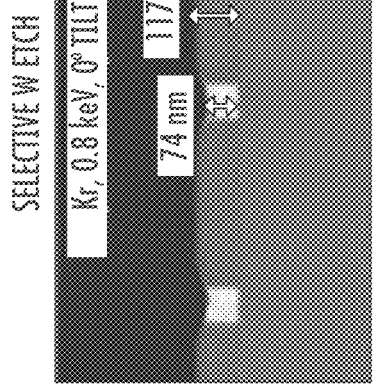

Turning now to FIG. 5A, FIG. B, FIG. 5C, and FIG. 5D, there is shown one example of tuning of selective deposition in accordance with the present embodiments. In FIG. 5A, a substrate 250 having an initial patterned structure made of 130 nm high stripes of tungsten and silicon is provided on the surface of the substrate 250. FIGS. 5B-5D illustrate the ability to tune the etch ratio of tungsten to silicon in these stripes by varying the process parameters for a krypton ion beam used to treat the substrate 250. In FIG. 5B an 800 eV Kr beam is directed at zero degrees angle of incidence with respect to perpendicular to the plane of the substrate 250. This condition results in a sputter rate selectivity, or etch selectivity of W/Si of 4.3/1, meaning tungsten etches 4.3 times faster than silicon. In FIG. 5C a 3 keV Kr beam is directed at 45 degrees angle of incidence with respect to perpendicular to the plane of the substrate 250. This condition results in an etch selectivity of W/Si of 1/1, meaning the etch rates are equal. In FIG. 5D an 800 eV Kr beam is directed at 66 degrees angle of incidence with respect to perpendicular to the plane of the substrate 250. This condition results in an etch selectivity of W/Si of 1/3.5, meaning tungsten etches 3.5 times slower than silicon.

With reference to FIGS. 1B and 1C, and in accordance with various embodiments, to generate selective deposition of a material, an ion beam, such as an inert gas ion beam like Kr, may be directed to a patterned substrate from an ion source, such as ion source 107, in conjunction with exposure to a deposition source. For example, with reference also to FIG. 5B, an aluminum or a carbon material may be deposited on the substrate 250 using deposition source 102, while an 800 eV Kr beam is directed to the substrate 250 using the ion source 107. In this manner, while carbon material is depositing on the substrate 250, the silicon portions of the substrate 250 surface may be etched more readily by the Kr ions than the tungsten portions, given the W/Si etch selectivity of 1/3.5. Thus, by appropriate tuning of the flux of carbon material directed from the deposition source 102 with respect to Kr ions directed from the source 107, deposition of carbon on tungsten regions of substrate 250 may tend to proceed, while deposition of carbon on silicon regions may be suppressed.

In another example, using the same configuration of deposition source 102 and ion source 107, the selective deposition of carbon on silicon regions may be enhanced, while deposition is suppressed on tungsten by directing an 800 eV Kr beam at zero degrees incidence, where W/Si etch selectivity is 4.3/1 (see FIG. 5B).

Figure 6A:
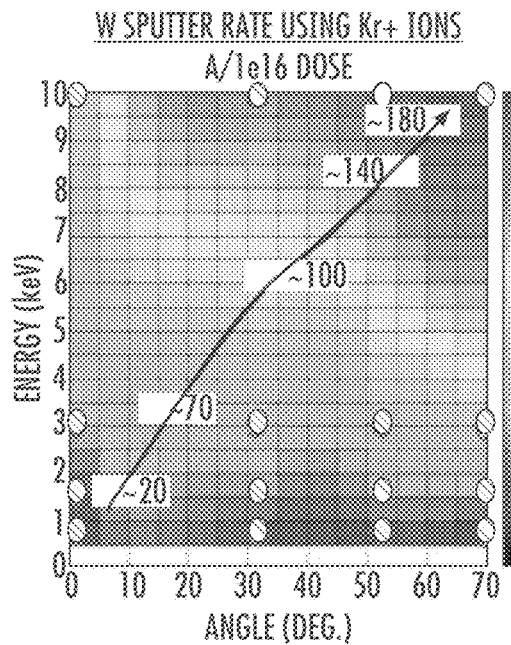
FIG. 6A, FIG. 6B, and FIG. 6C show two dimensional maps of sputtering behavior for Kr ion beam treatment of the tungsten/silicon system.
Figure 6B:
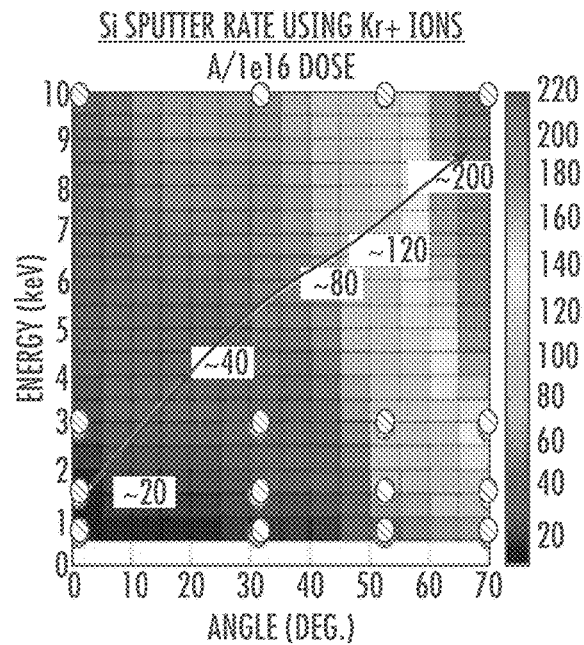
Figure 6C:
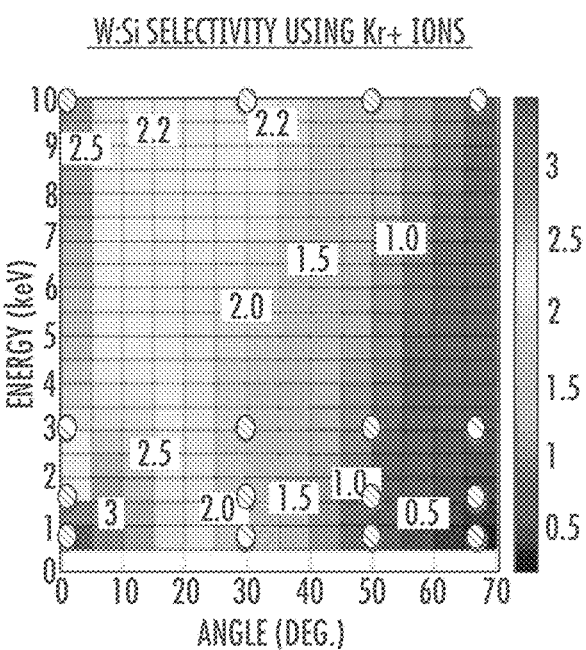

As suggested by the examples of FIG. 5B-5D, the angle of incidence as well as ion energy of an ion beam may be tuned to adjust selective deposition of material on a patterned substrate. Turning to FIG. 6A, FIG. 6B, and FIG. 6C, there are shown two dimensional maps of sputtering behavior for Kr ion beam treatment of the tungsten/silicon system.

In each of the figures, sputter rate or relative sputter rate is depicted by shading, as a function of ion energy (Y-axis) and angle of incidence (X-Axis) with respect to perpendicular to plane of the surface of the material. The graphs are simulations based upon experimental data points, shown as circles. In FIGS. 6A and 6B the sputter rate is shown as Å/(1 E16/cm$^2$) ion dose. While the tungsten (FIG. 6A) and the silicon (FIG. 6B) sputter rate tends to increase with increasing angle of incidence and increasing ion energy, as shown by the arrows, the W/Si sputter ratio (FIG. 6C) exhibits more complex behavior. At or near normal incidence (zero degrees) the W/Si sputter ratio is relatively higher, in the range of 2-3.5, while decreasing at higher angles of incidence. The W/Si sputter ratio is lowest at high angles of incidence (>60 degrees) and low ion energy (less than 2 keV). The behavior as a function of ion energy is more complex: at low angles of incidence (<20 degrees) the W/Si sputter ratio decreases slightly with increased ion energy up to 10 keV, while at higher angles of incidence (>30 degrees) the W/Si sputter ration increases with ion energy. Accordingly, the information of FIGS. 6A-6C may be used to adjust ion energy to a target ion energy and angle of incidence to a targeted angle of incidence to facilitate selective deposition on a patterned substrate according to the materials on the surface of the patterned substrate. The adjustment of ion energy and angle of incidence of ions may also take into account practical considerations, such as the range of ion energy available from a given ion source, as well as the practical angle of incidence range available in a given system configuration.

According to some embodiments, the controller 105 of a system, such as deposition system 100, may be used to adjust and control process parameters to facilitate selective deposition. The controller 105 may further include a memory or memory unit, coupled to a processor, where the memory unit contains a beam adjustment routine. The beam adjustment routine may be operative on the processor to manage ion beams as described below. The memory unit may comprise an article of manufacture. In one embodiment, the memory unit may comprise any non-transitory computer readable medium or machine readable medium, such as an optical, magnetic or semiconductor storage. The storage medium may store various types of computer executable instructions to implement one or more of logic flows described herein. Examples of a computer readable or machine-readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The embodiments are not limited in this context.

In various embodiments, the controller 105 may be operative to receive a set of selective deposition information, such as the materials in a patterned substrate surface (e.g., tungsten and silicon), the material to be selectively deposited (e.g., aluminum), and other information. The controller 105 may be operative to generate a set of process parameters responsive to the selective deposition information, where the set of process parameters are to be applied to an ion source or ion source/deposition source combination to perform the selective deposition. Such process parameters may include ion energy, angle of incidence, substrate temperature, and so forth. In other words, the controller 105 may establish the angle of incidence, ion energy, and other ion beam conditions suitable for selective deposition according to the substrate structure and material to be deposited.

In additional embodiments, the deposition system 130 or system 150 may be arranged wherein the deposition source 102 or deposition source 152 provide angled ions, similarly to the ion source 107 or ion source 154, respectively. In other words, both the deposition source and an additional ion source, not used for deposition, may direct angled ions to promote selective deposition of the material provided by the deposition source. In these embodiments, the different sputter yield for the different surface regions of the substrate may be considered for both depositing angled ions provided from a deposition source, and non-depositing angled ions, in order to choose appropriate angles of incidence for ions from the deposition source and from the additional ion source.

In additional embodiments of the disclosure, angled ions may be used to perform selective deposition on a patterned substrate including surface feature(s), where the surface feature may be a three-dimensional surface feature. For example, the surface feature may be characterized by a first surface region extending parallel to the plane of a substrate, and a second surface region extending at a non-zero angle of inclination with respect to the plane of the substrate, or with respect to the first surface region.

Figure 7A:
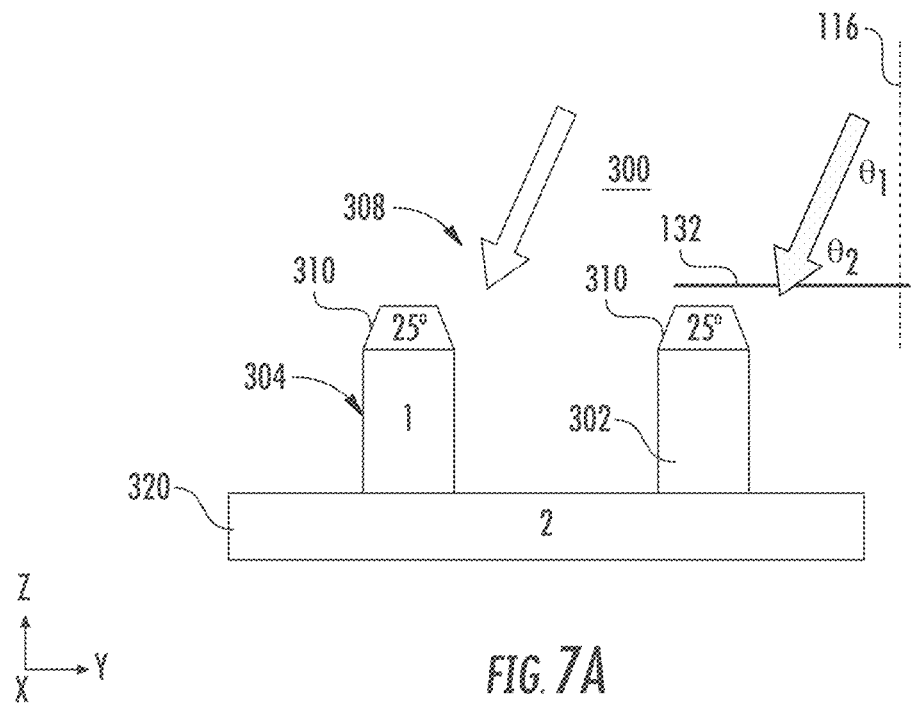
FIG. 7A depicts one arrangement, for selective deposition using angled ions, in accordance with some embodiments of the disclosure.

FIG. 7A depicts an arrangement 300, for selective deposition using angled ions 308. In the arrangement 300, a plurality of surface features, shown as surface features 302, are provided on a substrate 320, where the surface features 302 may be formed of the same material or a different material than substrate 320. The surface feature 302 may have a first surface region 306 defining the top of the surface feature 302 and extends parallel to the plane of the substrate 132 for substrate 320. The surface feature 302 may have a second surface region 304 defining sidewalls of the surface feature 302 and extends, in one example, along the perpendicular 116 to the plane of the substrate 132. The angled ions 308 may have trajectories extending at a non-zero angle of incidence with respect to the perpendicular 116. The angled ions may be depositing species, such as aluminum ions. The angle of incidence of angled ions 308, shown as $\theta_1$, may be arranged wherein the sputtering rate generated by the angled ions 308 on the first surface region 306 is relatively lower as compared to the sputtering rate on the second surface region 304. For example, in the case of Al$^+$ ions $\theta_1$ may equal 25 degrees, while 02, the angle defined between the angled ions 308 and the plane of the substrate 132 for substrate 320, is 65 degrees. If the second surface region 304 extends along the perpendicular 116, the angle $\theta_2$ represents the angle the angled ions 308 define with respect to the normal to the second surface region 304. Under these conditions, the sputter rate on second surface region 304 may be higher than on first surface region 306, wherein net deposition of depositing species from the angled ions 308 may occur on the first surface region 306, and not on the second surface region 304. Accordingly, a selective deposit 310 is formed just on the tops of the surface features 302.

Figure 7B:
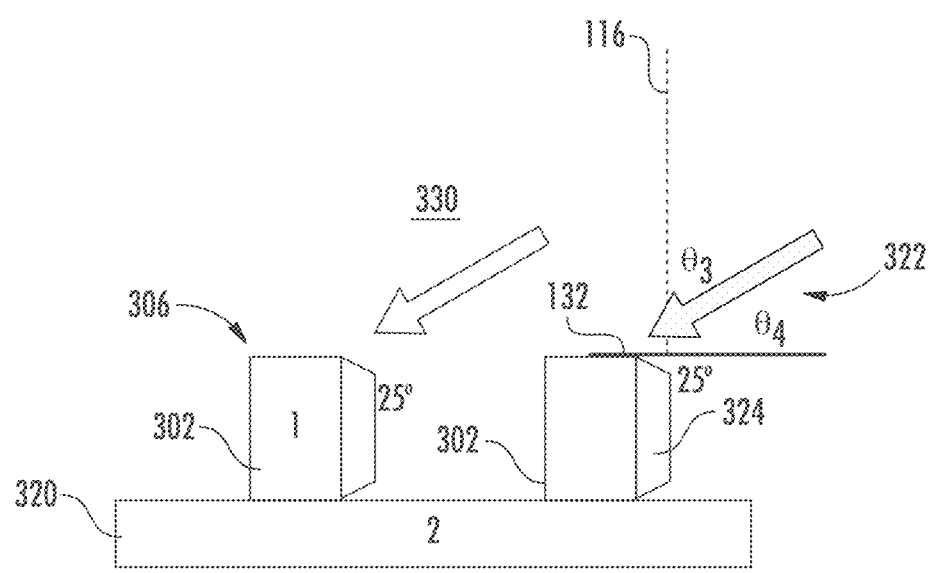
FIG. 7B depicts another arrangement, for selective deposition using angled ions, in accordance with some embodiments of the disclosure.

Turning to arrangement 330 of FIG. 7B, where the substrate geometry is as described for FIG. 7A, angled ions 322 are provided at a higher angle of incidence, $\theta_3$. For example, $\theta_3$ may equal 65 degrees, where the sputter yield on the first surface region 306 is much higher than at 25 degrees. Conversely, the sputter yield on the second surface region 304 is determined by $\theta_4$, the angle defined between the angled ions 322 and the plane of the substrate 132 for substrate 320, is 25 degrees, where sputter yield is relatively lower, leading to net deposition of a selective deposit 324 just on the second surface region 304.

Figure 8A:
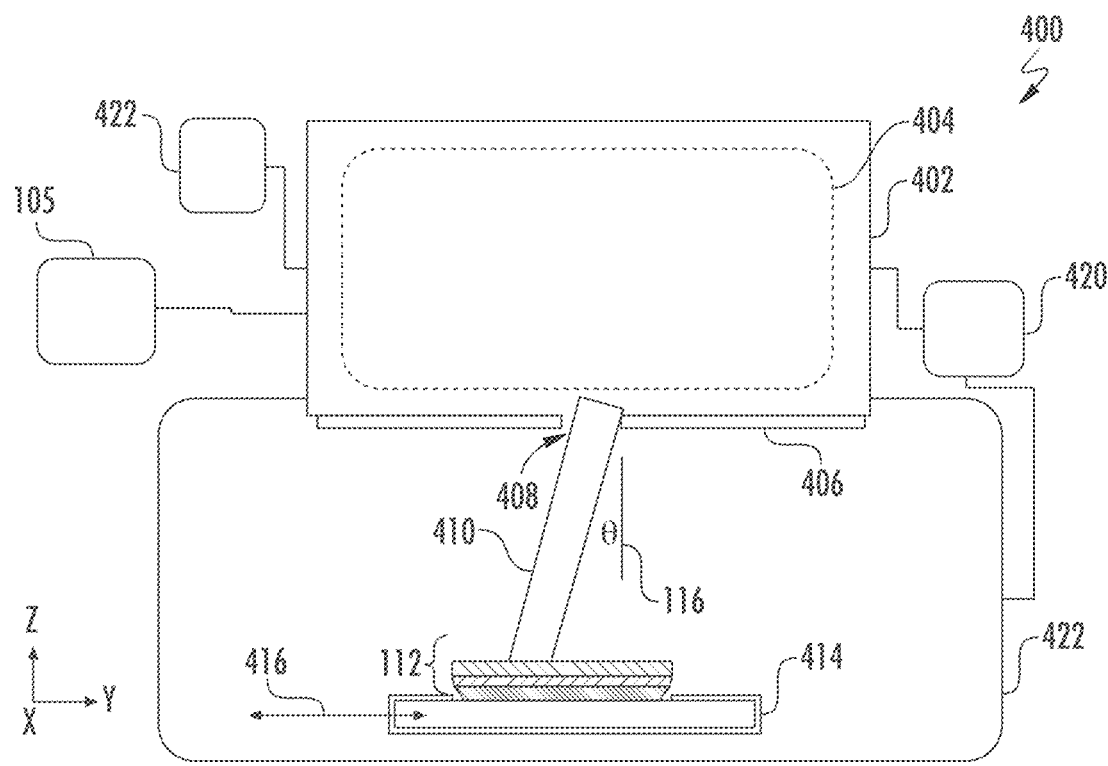
FIG. 8A shows side view of a processing apparatus, according to various embodiment of the disclosure.

Turning now to FIG. 8A, there is shown a processing apparatus 400, depicted in schematic form. The processing apparatus 400 represents a processing apparatus for selectively depositing a material using angled ions, as described above. The processing apparatus 400 may be a plasma based processing system having a plasma chamber 402 for generating a plasma 404 therein by any convenient method as known in the art. An extraction plate 406 may be provided as shown, having an extraction aperture 408, where a selective etching may be performed to reactively etch an insulator layer with respect to a mask material. A substrate 112, such as a semiconductor wafer, is disposed in the process chamber 422. A substrate plane of the substrate 112 is represented by the X-Y plane of the Cartesian coordinate system shown, while a perpendicular to the plane of the substrate 112 lies along the Z-axis (Z-direction).

During a selective deposition operation, an ion beam 410 is extracted through the extraction aperture 408 as shown. As shown in FIG. 8A, the trajectory of the ion beam 410 forms a non-zero angle of incidence with respect to the perpendicular 116, shown as θ. The trajectories of ions within the ion beam 410 may be mutually parallel to one another or may lie within a narrow angular range, such as within 10 degrees of one another or less. Thus, the value of θ may represent an average value of incidence angle where the individually trajectories vary up to several degrees from the average value. The ion beam 410 may be extracted when a voltage difference is applied using bias supply 420 between the plasma chamber 402 and substrate 112 as in known systems. The bias supply 420 may be coupled to the process chamber 422, for example, where the process chamber 422 and substrate 112 are held at the same potential. In various embodiments, the ion beam 410 may be extracted as a continuous beam or as a pulsed ion beam as in known systems. For example, the bias supply 420 may be configured to supply a voltage difference between plasma chamber 402 and process chamber 422, as a pulsed DC voltage, where the voltage, pulse frequency, and duty cycle of the pulsed voltage may be independently adjusted from one another.

Figure 8B:
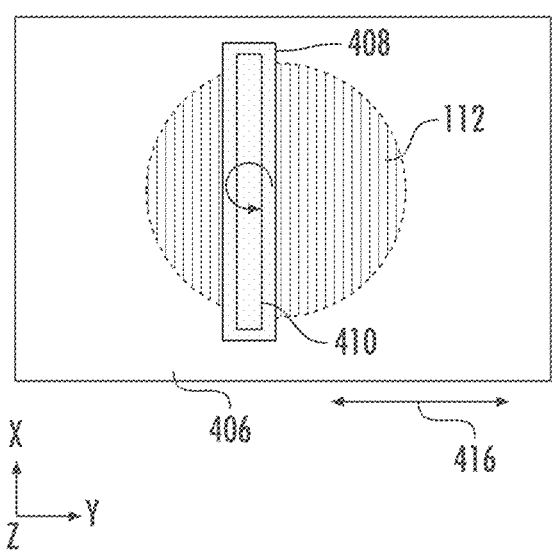
FIG. 8B. shows a top plan view of an ion beam geometry for one variant of the processing apparatus of FIG. 8A.

In various embodiments, for example, the ion beam 410 may be provided as a ribbon ion beam having a long axis extending along the X-direction of the Cartesian coordinate system shown in FIG. 8B. By scanning a substrate stage 414 including substrate 112 with respect to the extraction aperture 408, and thus with respect to the ion beam 410, along the scan direction 416, the ion beam 410 may selectively deposit a material on first substrate regions and not on second substrate regions, across an entirety of a substrate. As noted above, the ion beam 410 may be composed of depositing species, such as a metal, semiconductor, or insulator species.

In this example of FIG. 8B, the substrate 112 is a circular wafer, such as a silicon wafer, the extraction aperture 408 is an elongated aperture, having an elongated shape. The ion beam 410 is provided as a ribbon ion beam extending to a beam width along the X-direction, where the beam width is adequate to expose an entire width of the substrate 112, even at the widest part along the X-direction. Exemplary beam widths may be in the range of 10 cm, 20 cm, 30 cm, or more while exemplary beam lengths along the Y-direction may be in the range of 3 mm, 5 mm, 10 mm, or 20 mm. The embodiments are not limited in this context.

As also indicated in FIG. 8B, the substrate 112 may be scanned in the scan direction 416, where the scan direction 416 lies in the X-Y plane, such as along the Y-direction. Notably, the scan direction 416 may represent the scanning of substrate 112 in two opposing (180 degrees) directions along the Y-direction, or just a scan toward the left or a scan toward the right. As shown in FIG. 8B, the long axis of ion beam 410 extends along the X-direction, perpendicularly to the scan direction 416. Accordingly, an entirety of the substrate 112 may be exposed to the ion beam 410 when scanning of the substrate 112 takes place along a scan direction 416 to an adequate length from a left side to right side of substrate 112 as shown in FIG. 8B. Accordingly, a maskless selective deposition on first surface regions may be accomplished across an entire wafer, which surface regions may have lateral dimensions as small as micrometers, or as small as several nanometers in some embodiments.

Figure 8C:
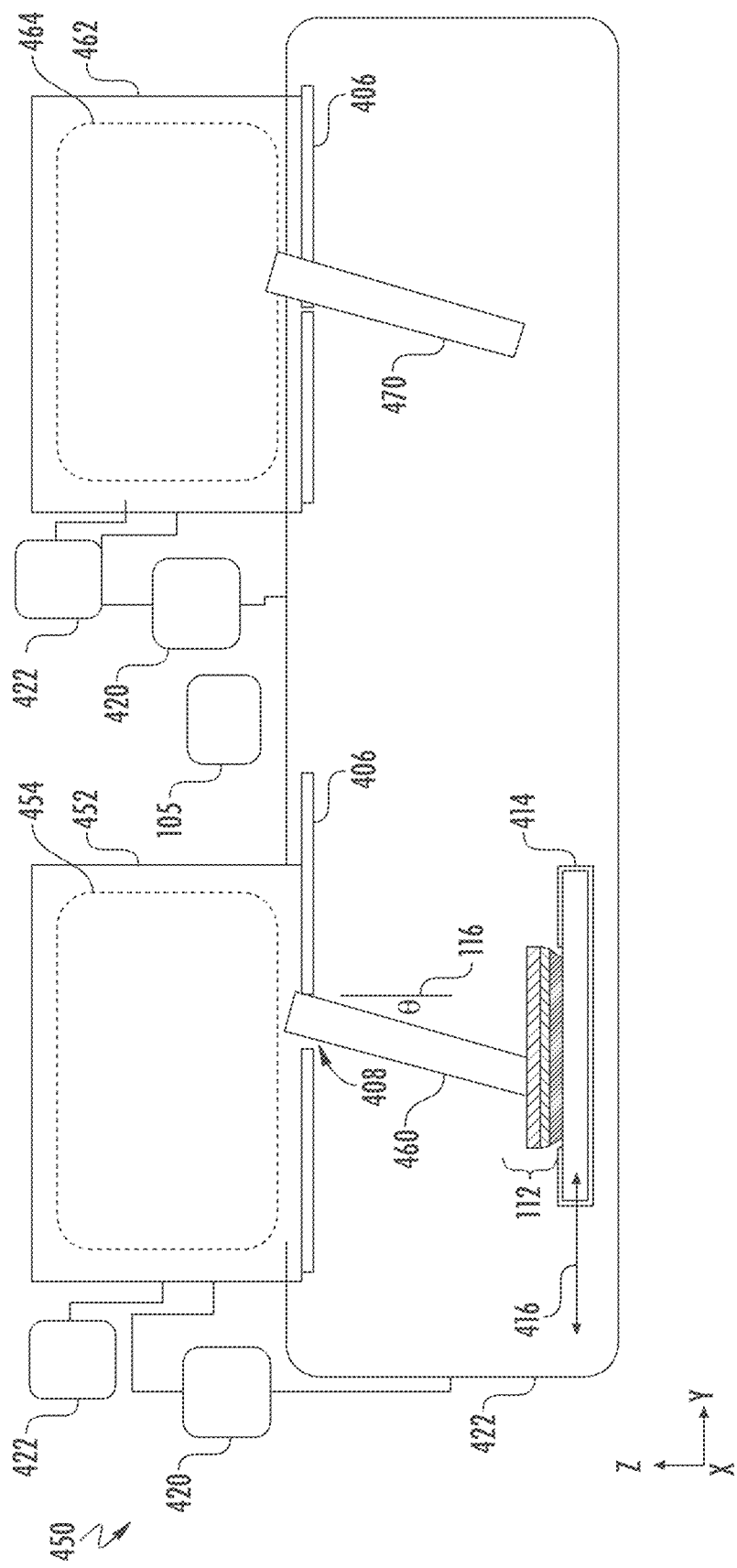
FIG. 8C shows a side view of another processing apparatus, according to various embodiment of the disclosure.

In additional embodiments, two separate plasma chambers may be provided, as shown in the system 450 in FIG. 8C. The system 450 includes a plasma chamber 452 and a plasma chamber 462, whose operation may proceed generally as described with respect to FIG. 8A, wherein a plasma 454 and plasma 464 are generated. The plasma chamber 452 may be used to produce an angled ion beam 460, used for generating depositing species, while the plasma chamber 462 generates an angled ion beam 470, used for sputtering while not generating depositing species. To perform a selective deposition process, the substrate 112 may be scanned between a first position under the plasma chamber 452 to a second position under the plasma chamber 462. In one variant of the system shown in FIG. 8C, the plasma chambers may be arranged in close proximity to one another, wherein the angled ion beam 460 and angled ion beam 470 simultaneously impinge upon substrate 112, as in FIG. 1C.

In embodiments, where pulsed ion beams are produced, by controlling the frequency (0 Hz-10 MHz) and duty cycle (0%-100%) of the pulsed ion beam from the plasma chamber 452 and plasma chamber 462, the net deposition rate on different surface regions of a substrate may be further controlled. Synchronizing of pulses two different plasma chambers to be in-phase or out-of-phase can allow for an extremely fast atomic layer deposition method (at >1 kHz), to be used for the selective deposition capability.

In various additional embodiments, the substrate temperature of a substrate stage, such as substrate stage 110, may be controlled to adjust the selectivity of deposition on a first surface region as opposed to a second surface region. As an example, the ratio of tungsten etch rate to SiO2 etch rate for 800 eV Kr ions at zero degrees incidence may decrease from 2.0 to 1.5 when substrate temperature is raised from room temperature to 200° C. Accordingly, selective deposition in a first surface region as opposed to a second surface region may be enhanced by appropriate adjustment of substrate temperature. Other combinations of ion energy and incidence angle may yield different changes in etch selectivity as a function of temperature.

For example, at a given substrate temperature an ion energy E1 and angle θ1 may yield a sputter etch ratio between a first surface region and second surface region of 2:1, while decreasing substrate temperature may result in sputter etching of the first surface region and deposition on the second surface region. In another example, at a given substrate temperature, and at an ion energy E2 and angle θ2 may yield deposition on a first surface region and a second surface region at a deposition ration of 2/1. Increasing the temperature of the substrate may result in deposition on first surface region and a net sputter etching on the second surface region.

While the above embodiments have emphasized techniques and apparatus to promote selective deposition on a first surface region, as opposed to a second surface region, the embodiments are not limited in this respect. In other embodiments, selective deposition on a first surface region may be promoted over deposition on a second surface region, as well as a third surface region, where the different surface regions may be formed of different materials, different surface orientations, or combinations of different materials and different surface orientations.

Figure 9:
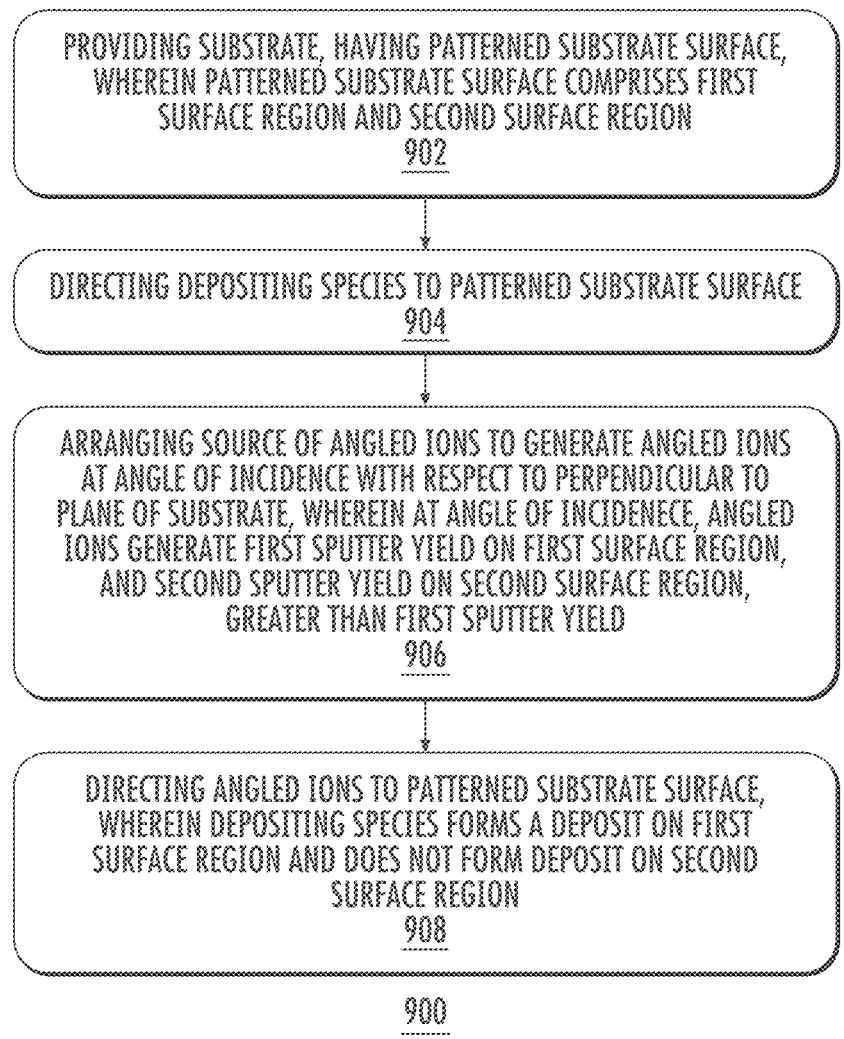
FIG. 9 depicts an exemplary process flow. shows side view of a processing apparatus, according to various embodiment of the disclosure.

FIG. 9 depicts an exemplary process flow 900, according to embodiments of the disclosure.

At block 902, a substrate is provided having a patterned substrate surface, including a first surface region and second surface region. The patterned substrate surface may include different materials in the first surface region as opposed to the second surface region. The patterned substrate may include surface features where the first surface region represents a top of a surface feature and the second surface region represents a sidewall of the surface feature. The embodiments are not limited in this context. At block 904 depositing species are directed to the substrate. In some examples the depositing species are directed as ions to the substrate.

At block 906, a source of angled ions is arranged to generate angled ions at an angle of incidence with respect to a perpendicular to a plane of the substrate. In various embodiments the angled ions are part of an ion beam. At the angle of incidence, the angled ions generate a first sputter yield on the first surface region and a second sputter yield on the second surface region, greater than first sputter yield. Said differently, the source of angled ions is arranged at an angle of incidence to preferentially sputter the second surface region as opposed to the first surface region.

At block 908, the angled ions are directed to the patterned substrate surface, wherein the depositing species forms a deposit on the first surface region and does not form a deposit on the second surface region. In some embodiments, the depositing species and the angled ions are one and the same. In other embodiments, the angled ions are different than the depositing species, and in some cases may constitute non-depositing species. For example, the depositing species may be a metallic element, a semiconductor, while the angled ions are an inert gas. In some embodiments where the angled ions are an inert gas, the depositing species may also be ions and may be directed to the substrate at a defined angle of incidence wherein the angled ions and depositing species generate a deposit just on the first region.

In sum, the present embodiments provide the advantage of the ability to perform selective deposition of a material on a substrate, such as a planar surface, without the use of a mask. The present embodiments also provide the advantage where selective deposition is accomplished without the need for complex gas phase chemistry as used in CVD and ALD processes, for example. The present embodiments provide the further advantage of self-aligned selective deposition, meaning the location of a deposit is determined by the location of a relatively low-sputter yield region on a patterned substrate surface.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method, comprising:
providing a substrate, the substrate having a patterned substrate surface, wherein the patterned substrate surface comprises a first surface region and a second surface region;
directing a depositing species to the patterned substrate surface; and
directing angled ions to the patterned substrate surface, wherein the first surface region and the second surface region are exposed to the depositing species and the angled ions, and wherein the depositing species forms a deposit on the first surface region and does not form a deposit on the second surface region.

2. The method of claim 1, wherein the angled ions and the depositing species are generated simultaneously by a first ion source.

3. The method of claim 1, wherein the angled ions comprise an angle of incidence with respect to a perpendicular to a plane of the substrate, wherein at the angle of incidence, the angled ions generate a first sputter yield on the first surface region and a second sputter yield on the second surface region, greater than the first sputter yield.

4. The method of claim 2, wherein the angled ions comprise a first ion beam, the method further comprising directing second angled ions as a second ion beam from a second ion source, separate from the first ion source.

5. The method of claim 4, wherein the directing the depositing species takes place simultaneously with the directing the second angled ions.

6. The method of claim 4, wherein the directing the depositing species takes place at a first instance when the substrate is disposed at a first substrate position, and wherein the directing the second angled ions takes place when the substrate is disposed at a second position at a second instance, the method further comprising scanning the substrate from the first position to the second position between the first instance and the second instance.

7. The method of claim 4, wherein the substrate is disposed in a process chamber, and wherein the directing the depositing species comprises extracting the first ion beam as a first ribbon ion beam from a first plasma source, and wherein the directing the second angled ions comprises extracting the second ion beam as a second ribbon ion beam from a second plasma source, adjacent the process chamber.

8. The method of claim 1, wherein the first surface region defines a plane of the substrate, the method further comprising:
before the directing the angled ions, arranging a source of the angled ions to generate the angled ions at an angle of incidence with respect to the a perpendicular to the plane of the substrate, wherein at the angle of incidence, the angled ions generate a first sputter yield on the first surface region and a second sputter yield on the second surface region, greater than the first sputter yield.

9. The method of claim 8, wherein the substrate comprises at least one surface feature, wherein the at least one surface feature comprises the first surface region and the second surface region, wherein the second surface region extends at a non-zero angle of inclination with respect to the first surface region.

10. The method of claim 8, wherein the second surface region extends along the plane of the substrate, wherein the first surface region comprises a first material, wherein the second surface region comprises a second material, different from the first material.

11. The method of claim 8, further comprising adjusting an ion energy of the angled ions to a target ion energy, wherein a sputter rate selectivity of the second material is increased with respect to the first material.

12. The method of claim 1, wherein the directing the angled ions and the directing the depositing species takes place at a first substrate temperature, wherein the depositing species does not form a deposit in the second surface region at the first substrate temperature, wherein at a second substrate temperature, different from the first substrate temperature, the depositing species forms a deposit on the first surface region and on the second surface region.

13. A method, comprising:
providing a substrate, the substrate having a patterned substrate surface, wherein the patterned substrate surface comprises a first surface region and a second surface region; and
directing a depositing species as angled ions to the first surface region and the second surface region of the patterned substrate surface of the substrate, at an angle of incidence with respect to a perpendicular to a plane of the substrate,
wherein at the angle of incidence, the angled ions generate a first sputter yield on the first surface region and a second sputter yield on the second surface region, greater than the first sputter yield, and wherein the depositing species forms a deposit on the first surface region and does not form a deposit on the second surface region.

14. The method of claim 13, wherein the angled ions are generated as first angled ions from a first ion source, the method further comprising: directing second angled ions as a second ion beam from a second ion source, separate from the first ion source.

15. The method of claim 14, wherein the directing the depositing species takes place simultaneously with the directing the second angled ions.

16. The method of claim 14, wherein the directing the depositing species takes place at a first instance when the substrate is disposed at a first substrate position, and wherein the directing the second angled ions takes place when the substrate is disposed at a second position at a second instance, the method further comprising scanning the substrate from the first position to the second position between the first instance and the second instance.

* * * * *